United States Patent
Hsu et al.

(10) Patent No.: US 12,051,614 B2
(45) Date of Patent: *Jul. 30, 2024

(54) ISOLATION REGIONS INCLUDING TWO LAYERS AND METHOD FORMING SAME

(71) Applicant: Taiwan Semiconductor Manufacturing Co., Ltd., Hsinchu (TW)

(72) Inventors: Tsung Han Hsu, Hsinchu (TW); Kuan-Cheng Wang, Toufen Township (TW); Han-Ti Hsiaw, Zhubei (TW); Shin-Yeu Tsai, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 46 days.

This patent is subject to a terminal disclaimer.

(21) Appl. No.: 17/340,734

(22) Filed: Jun. 7, 2021

(65) Prior Publication Data
US 2021/0296160 A1 Sep. 23, 2021

Related U.S. Application Data

(60) Continuation of application No. 15/945,091, filed on Apr. 4, 2018, now Pat. No. 11,031,280, which is a (Continued)

(51) Int. Cl.
*H01L 21/762* (2006.01)
*H01L 21/02* (2006.01)
(Continued)

(52) U.S. Cl.
CPC .. *H01L 21/76224* (2013.01); *H01L 21/02271* (2013.01); *H01L 21/30604* (2013.01);
(Continued)

(58) Field of Classification Search
CPC ......... H01L 21/76224; H01L 21/02271; H01L 21/324; H01L 21/30604; H01L 29/0649
(Continued)

(56) References Cited

U.S. PATENT DOCUMENTS 4,871,689 A * 10/1989 Bergami ........... H01L 21/76229
257/E21.548
7,803,722 B2 9/2010 Liang
(Continued)

FOREIGN PATENT DOCUMENTS

CN 102652353 A 8/2012
CN 105489484 A 4/2016

*Primary Examiner* — Quoc D Hoang
(74) *Attorney, Agent, or Firm* — Slater Matsil, LLP

(57) ABSTRACT

A method includes etching a semiconductor substrate to form trenches extending into the semiconductor substrate, and depositing a first dielectric layer into the trenches. The first dielectric layer fills lower portions of the trenches. A Ultra-Violet (UV) treatment is performed on the first dielectric layer in an oxygen-containing process gas. The method further includes depositing a second dielectric layer into the trenches. The second dielectric layer fills upper portions of the trenches. A thermal treatment is performed on the second dielectric layer in an additional oxygen-containing process gas. After the thermal treatment, an anneal is performed on the first dielectric layer and the second dielectric layer.

20 Claims, 13 Drawing Sheets

Related U.S. Application Data division of application No. 15/257,417, filed on Sep. 6, 2016, now Pat. No. 9,960,074.

(60) Provisional application No. 62/357,219, filed on Jun. 30, 2016.

(51) Int. Cl.
| | |
|---|---|
| *H01L 21/306* | (2006.01) |
| *H01L 21/324* | (2006.01) |
| *H01L 21/8234* | (2006.01) |
| *H01L 29/06* | (2006.01) |
| *H01L 29/66* | (2006.01) |
| *H01L 29/78* | (2006.01) |

(52) U.S. Cl.
CPC .... *H01L 21/324* (2013.01); *H01L 21/823431* (2013.01); *H01L 21/823481* (2013.01); *H01L 29/0649* (2013.01); *H01L 29/66795* (2013.01); *H01L 29/785* (2013.01)

(58) Field of Classification Search
USPC .......................................... 257/401
See application file for complete search history.

(56) References Cited

U.S. PATENT DOCUMENTS

| | | | |
|---|---|---|---|
| 8,232,176 B2 | 7/2012 | Lubomirsky et al. | |
| 8,728,958 B2 | 5/2014 | Ashtiani et al. | |
| 8,823,132 B2 | 9/2014 | Liou et al. | |
| 9,831,114 B1* | 11/2017 | Lu | H01L 29/0638 |
| 9,960,074 B2* | 5/2018 | Hsu | H01L 21/30604 |
| 2006/0094203 A1* | 5/2006 | Choi | H01L 27/11521 |
| | | | 257/E21.549 |
| 2006/0246657 A1 | 11/2006 | Kim et al. | |
| 2007/0210403 A1 | 9/2007 | Sandhu | |
| 2008/0166854 A1 | 7/2008 | Shin et al. | |
| 2008/0280441 A1 | 11/2008 | Lee et al. | |
| 2009/0104790 A1 | 4/2009 | Liang | |
| 2010/0143609 A1* | 6/2010 | Fukazawa | H01L 21/0223 |
| | | | 427/585 |
| 2014/0264631 A1* | 9/2014 | Wei | H01L 23/544 |
| | | | 257/401 |
| 2016/0056171 A1 | 2/2016 | Manorotkul et al. | |
| 2016/0343608 A1* | 11/2016 | Umehara | H01L 21/02304 |

* cited by examiner

ISOLATION REGIONS INCLUDING TWO LAYERS AND METHOD FORMING SAME

PRIORITY CLAIM AND CROSS-REFERENCE

This application is a continuation of U.S. patent application Ser. No. 15/945,091, entitled "Isolation Regions Including Two Layers and Method Forming Same," filed Apr. 4, 2018, which is a divisional of U.S. patent application Ser. No. 15/257,417, entitled "Integrated Bi-Layer STI Deposition," filed Sep. 6, 2016, now U.S. Pat. No. 9,960,074 issued May 1, 2018, which claims the benefit of the following provisionally filed U.S. Patent Application: Application No. 62/357,219, filed Jun. 30, 2016, and entitled "Integrated Bi-Layer STI Deposition," which applications are hereby incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins.

In the formation of the STI regions and the formation of the FinFETs, STI regions are first formed, for example, using flowable oxide, followed by a post treatment using either Ultra-Violet (UV) curing or thermal oxidation in an oxygen-containing environment. The respective wafer is then annealed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
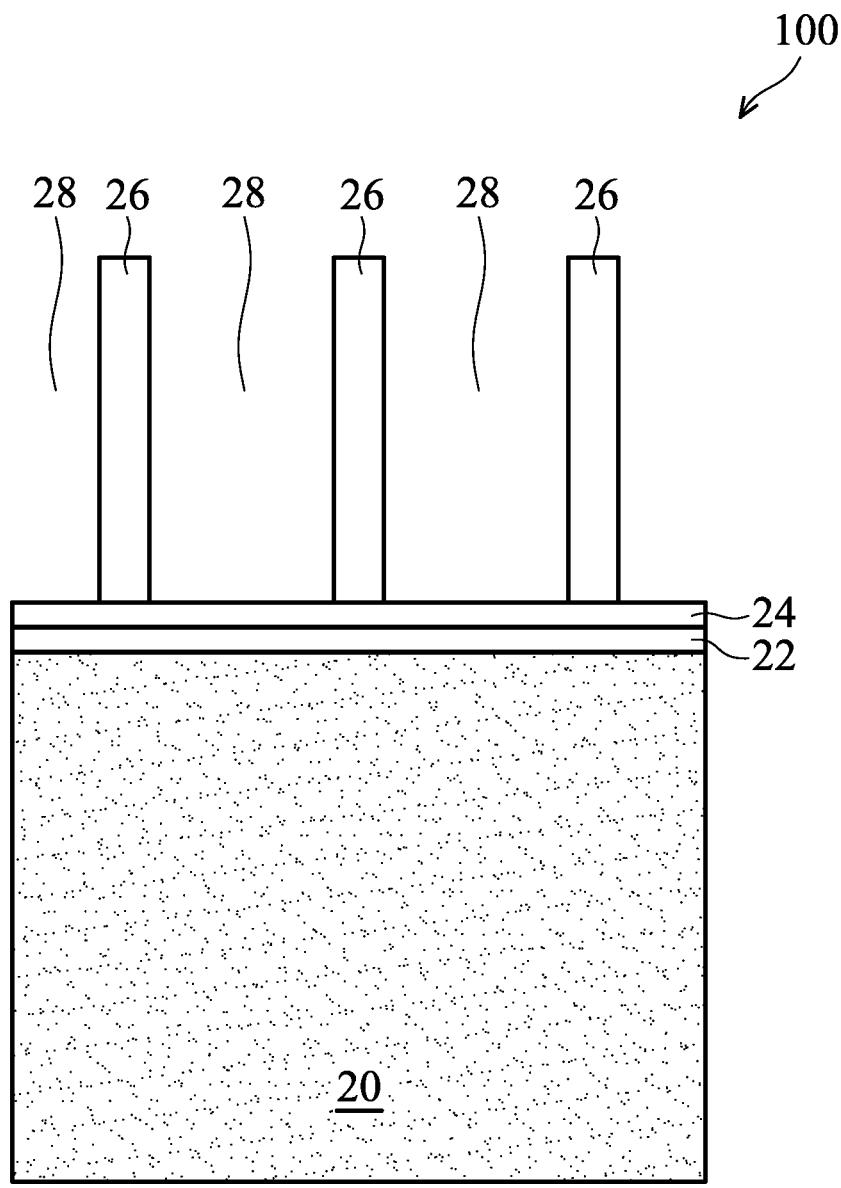
FIGS. 1 through 9C are cross-sectional views of intermediate stages in the manufacturing of Shallow Trench Isolation (STI) regions and Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Shallow Trench Isolation (STI) regions, Fin Field-Effect Transistors (FinFETs), and the methods of forming the same are provided. The intermediate stages in the formation of the STI regions and the FinFETs are illustrated in accordance with exemplary embodiments. Some variations of some embodiments are discussed.

Throughout the various views and illustrative embodiments, like reference numbers are used to designate like elements.

FIGS. 1 through 9C illustrate the cross-sectional views of intermediate stages in the formation of STI regions and a FinFET in accordance with some embodiments. The steps shown in FIGS. 1 through 9C are also illustrated schematically in the process flow shown in FIG. 10.

Referring to FIG. 1, semiconductor substrate 20, which is a part of semiconductor wafer 100, is provided. In accordance with some embodiments of the present disclosure, semiconductor substrate 20 includes crystalline silicon. Other commonly used materials, such as carbon, germanium, gallium, boron, arsenic, nitrogen, indium, and/or phosphorus, and the like, may also be included in semiconductor substrate 20. Semiconductor substrate 20 may also include other semiconductor materials such as III-V compound semiconductor materials. Semiconductor substrate 20 may be a bulk substrate or a Semiconductor-On-Insulator (SOI) substrate.

Pad layer 22 and mask layer 24 are formed on semiconductor substrate 20. Pad layer 22 may be a thin film including silicon oxide. In accordance with some embodiments of the present disclosure, pad oxide layer 22 is formed in a thermal oxidation process, wherein a top surface layer of semiconductor substrate 20 is oxidized. Pad layer 22 acts as an adhesion layer between semiconductor substrate 20 and mask layer 24. Pad layer 22 may also act as an etch stop layer for etching mask layer 24. In accordance with some embodiments of the present disclosure, mask layer 24 is formed of silicon nitride, for example, using Low-Pressure Chemical Vapor Deposition (LPCVD). In accordance with other embodiments of the present disclosure, mask layer 24 is formed by thermal nitridation of silicon, Plasma Enhanced Chemical Vapor Deposition (PECVD), or plasma anodic nitridation. Mask layer 24 is used as a hard mask during subsequent photolithography processes. Photo resist 26 is formed on mask layer 24 and is then patterned, forming openings 28 in photo resist 26.

Figure 2:
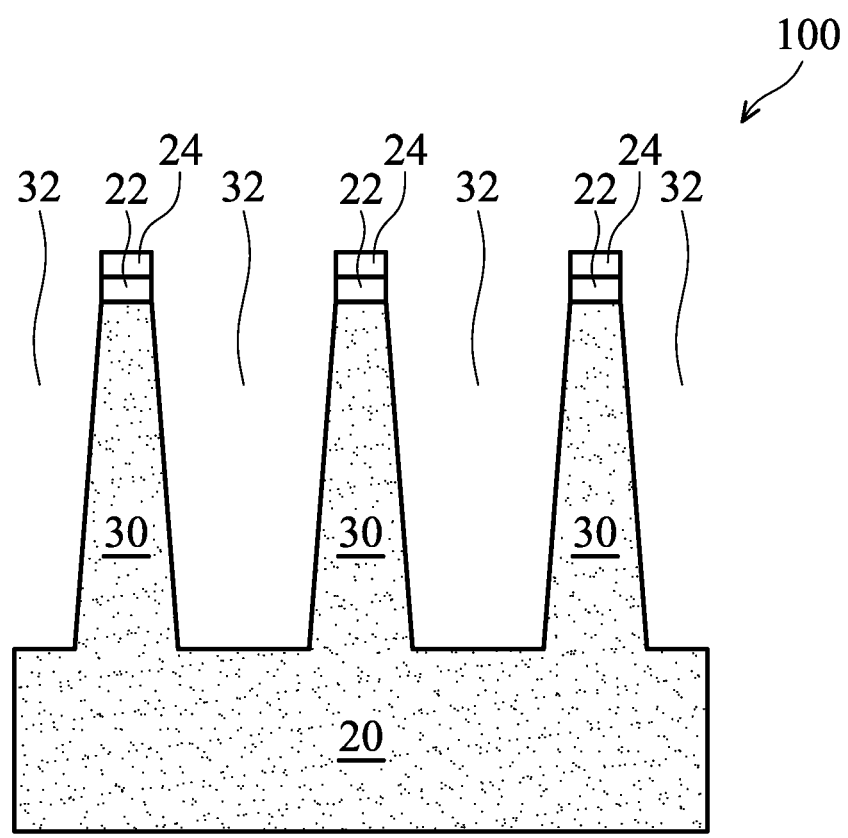

Referring to FIG. 2, mask layer 24 and pad layer 22 are etched, exposing underlying semiconductor substrate 20. The exposed semiconductor substrate 20 is then etched, forming trenches 32. The respective step is shown as step 202 in the process flow shown in FIG. 10. The portions of semiconductor substrate 20 between neighboring trenches 32 are referred to as semiconductor strips 30 hereinafter. Trenches 32 may have the shape of strips (when viewed in the top view of wafer 100) that are parallel to each other, and trenches 32 are closely located from each other. After the etching of semiconductor substrate 20, photo resist 26 (FIG. 1) is removed. Next, a cleaning step may be performed. The cleaning may be performed using diluted hydrofluoric (HF) acid, for example.

Figure 3:
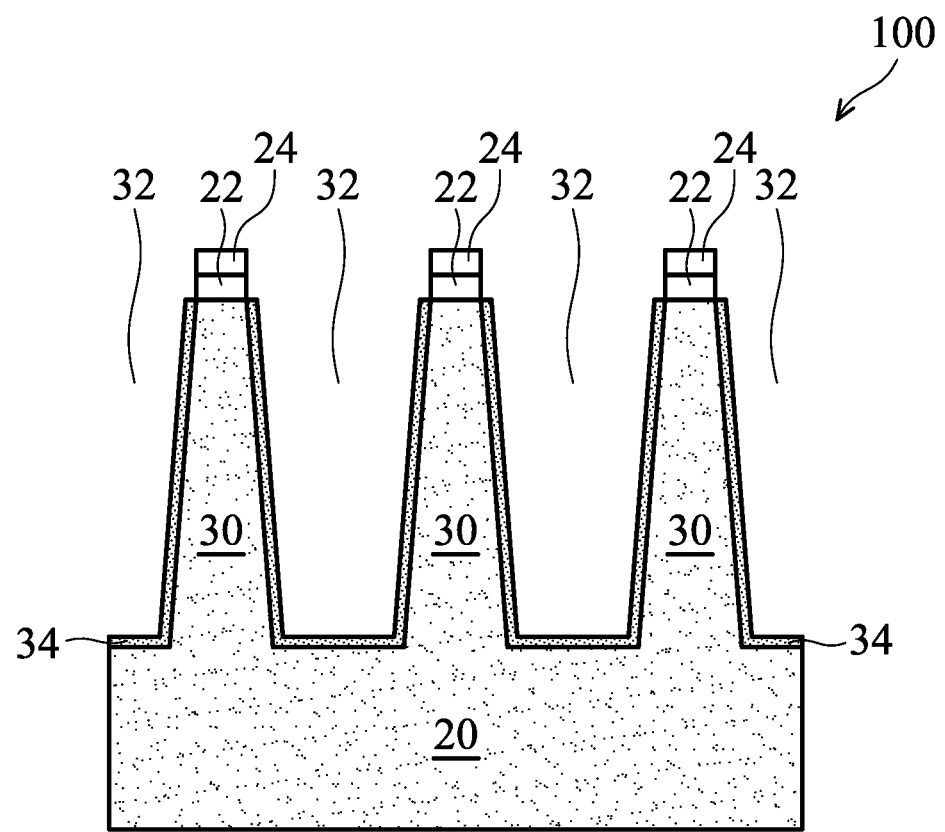

In accordance with some embodiments, liner oxide 34 is formed in trenches 32 and on the sidewalls of semiconductor strips 30, as is shown in FIG. 3. The respective step is shown as step 204 in the process flow shown in FIG. 10. Liner oxide 34 may be a conformal layer whose horizontal portions and vertical portions have thicknesses close to each other. Liner oxide 34 may be a thermal oxide having a thickness between about 10 Å to about 100 Å in accordance with some exemplary embodiments. In accordance with some embodiments of the present disclosure, liner oxide 34 is formed by oxidizing wafer 100 in an oxygen-containing environment, for example, through Local Oxidation of Silicon (LOCOS), wherein oxygen ($O_2$) may be included in the respective process gas. In accordance with other embodiments of the present disclosure, liner oxide 34 is formed using In-Situ Steam Generation (ISSG), for example, with water steam or a combined gas of hydrogen ($H_2$) and oxygen ($O_2$) used to oxidize semiconductor strips 30. The ISSG oxidation may be performed at an elevated temperature. In accordance with yet other embodiments, liner oxide 34 is formed using a deposition technique such as Sub Atmospheric Chemical Vapor Deposition (SACVD). The formation of liner oxide 34 may result in the rounding of the corners of trenches 32, which reduces the electrical fields of the resulting FinFET, and hence improves the performance of the resulting integrated circuit. In accordance with alternative embodiments of the present disclosure, the formation of liner oxide 34 is skipped.

Figure 4:
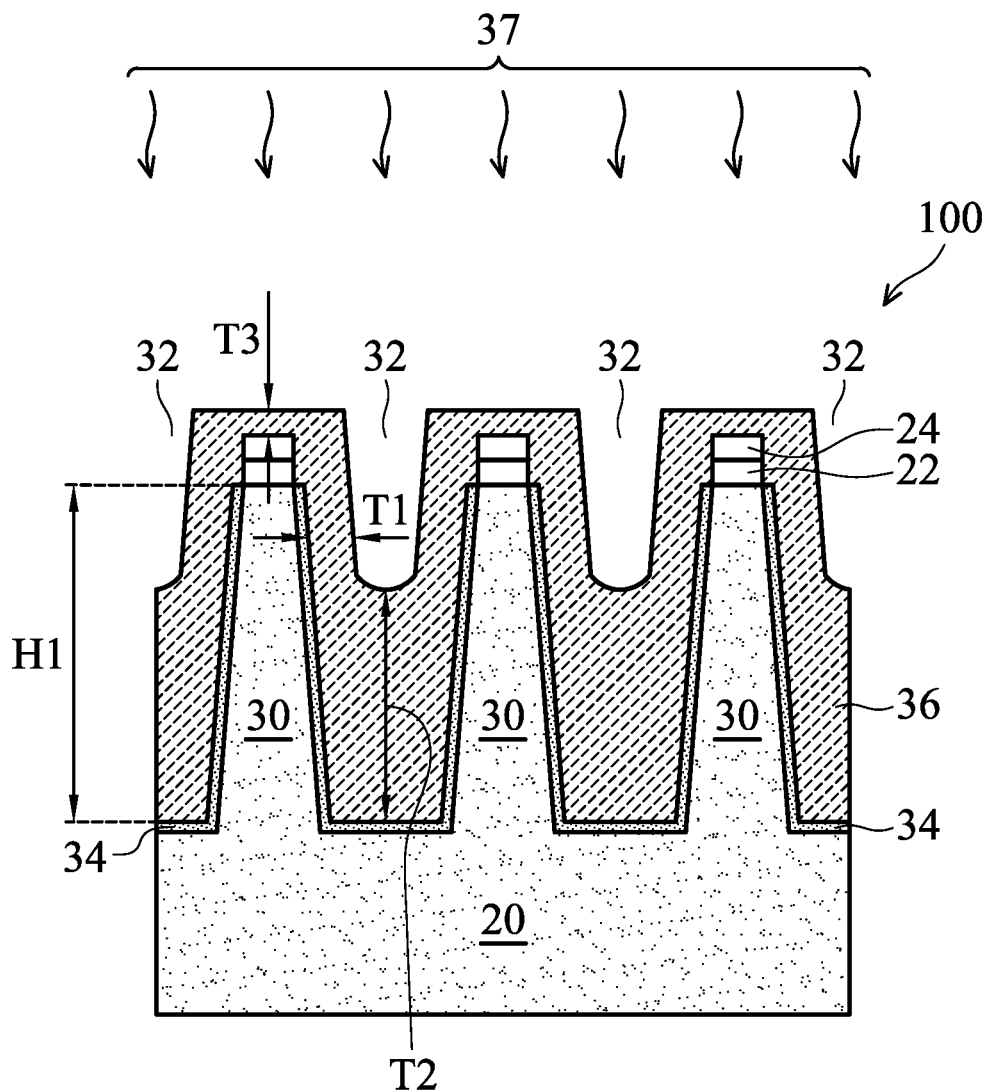

FIG. 4 illustrates the deposition/formation of dielectric layer 36. The respective step is shown as step 206 in the process flow shown in FIG. 10. Dielectric layer 36 fills the lower portions of trenches 32, and some upper portions of trenches 32 remain unfilled. In accordance with some embodiments, dielectric layer 36 is conformal or close to conformal, wherein thickness T1 of the vertical portions of dielectric layer 36 is close to thickness T2 of the horizontal portions of dielectric layer 36. In accordance with alternative embodiments of the present disclosure, dielectric layer 36 is non-conformal, and thickness T2 is greater than thickness T1. The formation method of dielectric layer 36 may be selected from Flowable Chemical Vapor Deposition (FCVD), Chemical Vapor Deposition (CVD), Atomic Layer Deposition (ALD), and the like. In the embodiments wherein liner oxide 34 is formed, liner oxide 34 is in contact with semiconductor strips 30, and dielectric layer 36 is formed on, and contacting, liner oxide 34. In accordance with alternative embodiments of the present disclosure, liner oxide 34 is not formed, and hence dielectric layer 36 is in contact with the sidewalls of semiconductor strips 30 and top surfaces of the underlying substrate 20.

In accordance with some embodiments in which FCVD is used, a silicon- and nitrogen-containing precursor (for example, trisilylamine (TSA) or disilylamine (DSA)) is used, and hence the resulting dielectric layer 36 is flowable (jelly-like). In accordance with alternative embodiments of the present disclosure, the flowable oxide layer 36 is formed using an alkylamino silane based precursor. During the deposition, plasma is turned on to activate the gaseous precursors for forming the flowable oxide.

In accordance with yet alternative embodiments of the present disclosure, dielectric layer 36 is formed using a general Chemical Vapor Deposition (CVD). Accordingly, the resulting dielectric layer 36 is conformal, with thickness T2 of the bottom portion of dielectric layer 36, thickness T1 of the sidewall portion of dielectric layer 36, and thickness T3 of the top portion of dielectric layer 36 being substantially equal to each other, for example, with differences smaller than about 10 percent of any of thicknesses T1, T2, and T3.

In accordance with alternative embodiments, dielectric layer 36 is formed using spin-on coating, wherein perhydropolysilazae-based precursors may be used.

Due to the flowable property and a high viscosity, flowable dielectric layer 36 may be non-conformal and has a greater thickness T2 at the bottoms of trenches, and smaller thicknesses T1 at the sidewalls of semiconductor strips 30 and smaller thicknesses T3 at the top of semiconductor strips 30. In accordance with some exemplary embodiments of the present disclosure, thickness T2 is greater than about 50 percent of height H1 of semiconductor strips 30. Thickness T2 may also be in the range between about 50 percent and about 70 percent height H1 of semiconductor strips 30. In accordance with other embodiments, thickness T2 may be smaller than about 50 percent of height H1 of semiconductor strips 30.

After the flowable oxide layer 36 is formed, a (first) post treatment is performed, which converts flowable dielectric layer 36 into a solid dielectric material. The solidified dielectric layer 36 is also referred to as dielectric layer 36. The respective step is shown as step 208 in the process flow shown in FIG. 10. In accordance with some exemplary embodiments, the post treatment is performed using a Ultra-Violet (UV) light 37 to treat flowable dielectric layer 36. In accordance with some exemplary embodiments, the UV treatment is performed at room temperature, for example, between about 18° C. and about 25° C. In accordance with alternative embodiments, the UV treatment is performed at a higher temperature, for example, between about 25° C. and about 300° C. Accordingly, the post treatment in accordance with these embodiments may be a UV treatment without thermal treatment, or may include both a UV treatment and a thermal treatment.

During the UV treatment, an oxygen-containing process gas is conducted into the process chamber in which wafer 100 is placed. The oxygen-containing process gas may include oxygen ($O_2$), ozone ($O_3$), or the combinations thereof. The treatment time may be between about 2 minutes and about 4 minutes. In addition, carrier gases such as argon, helium, or the like may also be added along with the oxygen-containing process gas.

Figure 5:
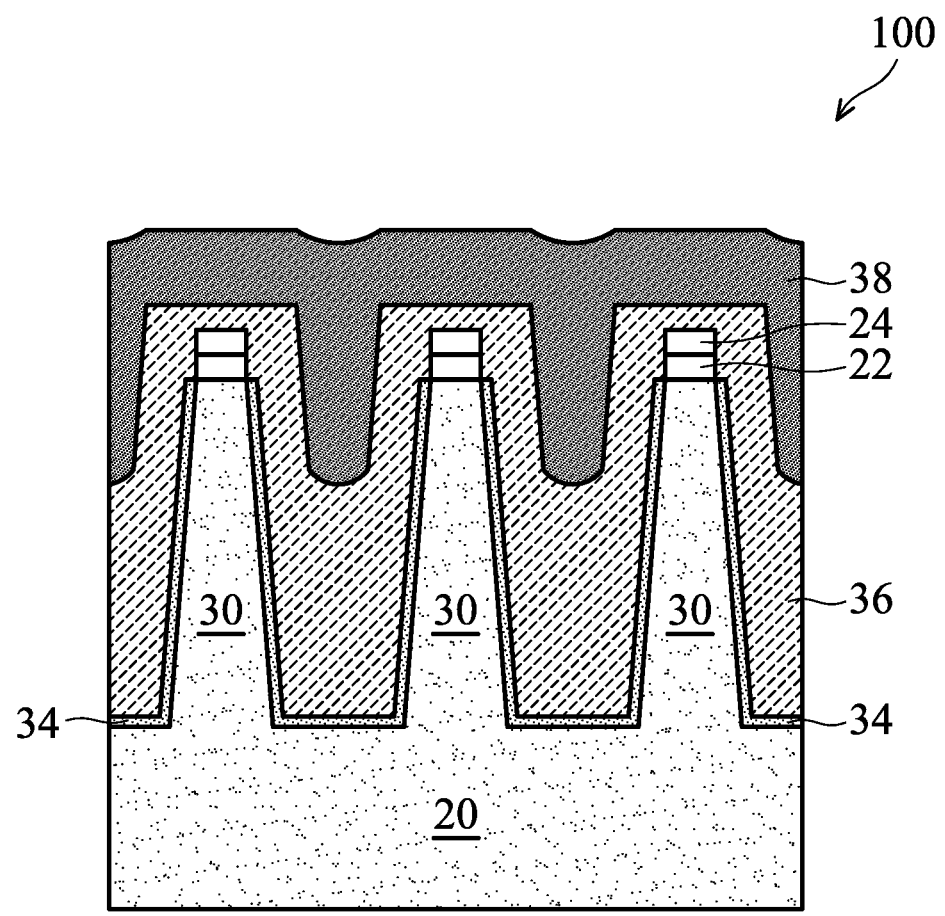

Next, referring to FIG. 5, dielectric layer 38 is formed to fill remaining trenches 32 (FIG. 4). The respective step is shown as step 210 in the process flow shown in FIG. 10. In accordance with some embodiments of the present disclosure, dielectric layer 38 is formed using FCVD, wherein a silicon-and-nitrogen-containing precursor such as TSA or DSA is used. The resulting dielectric layer 38 may thus be a flowable dielectric layer. In accordance with alternative embodiments of the present disclosure, the flowable dielectric layer 38 is formed using an alkylamino silane based precursor. During the deposition, plasma may be turned on to activate the gaseous precursors used for forming the flowable dielectric.

In accordance with yet embodiments of the present disclosure, dielectric layer 38 is formed using a general CVD or spin-on coating, wherein a perhydropolysilazae-based precursor may be used.

The deposition methods of dielectric layers 36 and 38 may be selected from the same group of candidate methods, and may be the same as each other or different from each other. The materials and compositions of dielectric layers 36 and 38 may be the same or different from each other. Throughout the description, when two layers are referred to as having the same composition, it means that the two layers have the same types of elements (such as Si, O, N, and H), and the percentages of the elements in two layers are the same as each other. Conversely, when two layers are referred to as having different compositions, it means that one of the two layers either has at least one element not in the other layer, or the two layers have the same elements, but the percentages of the elements in two layers are different from each other. In accordance with some embodiments of the present disclosure, both dielectric layers 36 and 38 are formed as flowable oxides, and may be formed using the same or different precursors. In addition, each of the process conditions such as the partial pressure, the temperature, the flow rate of precursors, the bias voltage, the on/off status of plasma, etc, for forming dielectric layers 36 and 38 may be the same as or different from each other.

In accordance with some embodiments of the present disclosure, after dielectric layer 38 is formed, a (second) post treatment is performed, which converts flowable dielectric layer 38 (if it is flowable) into a solid dielectric material. The respective step is shown as step 212 in the process flow shown in FIG. 10. The resulting dielectric material is also referred to as dielectric layer 38. In accordance with some exemplary embodiments, the post treatment is performed using a thermal treatment. During the post treatment of dielectric layer 38, no UV light is used. In accordance with some exemplary embodiments, the thermal treatment is performed at an elevated temperature higher than about 200° C. For example, the thermal treatment may be performed in a temperature range between about 200° C. and about 300° C. During the thermal treatment, an oxygen-containing process gas is conducted into the process chamber in which wafer 100 is placed. The oxygen-containing process gas may include oxygen ($O_2$), ozone ($O_3$), or combinations thereof. Steam ($H_2O$) may also be used, and may be used without oxygen ($O_2$) or ozone, or may be used in combination with oxygen ($O_2$) and/or ozone. The treatment time may be between about 4 hours and about 5 hours. As a result of the thermal treatment, dielectric layer 38 is cured and solidified. During the post treatment of dielectric layer 38, dielectric layer 36 is also treated. However, since dielectric layer 36 is under dielectric layer 38, the treatment effect is less effective on dielectric layer 36 than on dielectric layer 38.

After the post treatments of dielectric layers 36 and 38, dielectric layers 36 and 38 have distinguished compositions, and hence can be distinguished from each other. For example, dielectric layers 36 and 38 may both include Si—O bonds and Si—N bonds. Dielectric layer 36, however, has more Si—O bonds (per unit volume) than dielectric layer 38, and fewer Si—N bonds (per unit volume) than dielectric layer 38. The atomic percentage of oxygen in dielectric layer 36 may also be higher than the atomic percentage of oxygen in dielectric layer 38. The atomic percentage of nitrogen in dielectric layer 36 may also be lower than the atomic percentage of nitrogen in dielectric layer 38.

After the post treatments of dielectric layers 36 and 38, dielectric layers 36 and 38 also have distinguished properties, and hence can be distinguished from each other. For example, dielectric layer 36 may have a reflective index higher than about 1.6, and dielectric layer 38 may have a reflective index lower than about 1.5. The reflective index difference of dielectric layer 36 may be higher than the reflective index of dielectric layer 38 by about 0.1 or about 0.2. In accordance with some embodiments, the difference in the compositions and the properties of dielectric layers 36 and 38 is caused by the difference in the precursors, the difference in the deposition process conditions, etc. and hence dielectric layers 36 and 38 are different from each other as deposited (before post treated). In accordance with other embodiments, dielectric layers 36 and 38 are the same as each other as deposited (before being post treated), and the difference is the result of the difference in the post treatments. For example, the UV treatment of dielectric layer 36 results in the reflective index of dielectric layer 36 to be more than the Si—O bonds in dielectric layer 38, and the Si—O bonds in dielectric layer 36 to be higher than the reflective index of dielectric layer 38. The difference in the compositions and the properties of dielectric layers 36 and 38 may also be caused by both the difference in materials and the difference in post treatment methods.

The deposition and the post treatment of dielectric layers 36 and 38 may be in-situ performed in the same process chamber. Also, there may or may not be vacuum break during the deposition and the post treatment of dielectric layers 36 and 38. After the second post treatment, an anneal process is performed. The respective step is shown as step 214 in the process flow shown in FIG. 10. The anneal may be performed ex-situ than the formation and the treatment of dielectric layers 36 and 38, and may be performed, for example, in a furnace. In accordance with some embodiments, the anneal is performed at a temperature between about 400° C. and about 1200° C. The process for the anneal may include thermal annealing in a furnace, although other annealing methods may be used. An oxygen-containing gas (such as $O_2$) may also be conducted into the furnace when the anneal is performed. The duration of the anneal may be between about 15 minutes and about 3.5 hours in accordance with some exemplary embodiments. Through the annealing, dielectric materials 36 and 38 are densified.

When the aspect ratio of trenches 32 (FIG. 2) is high, for example, higher than about 8.7, and/or the width of trenches 32 is small, the anneal of dielectric layer 38 is more effective than the anneal of dielectric layer 36. In accordance with the embodiments of the present disclosure, dielectric layer 36 has already had materials/properties different from that of dielectric layer 38 when the anneal is started, and after the anneal, dielectric layer 36 remain to have materials/properties different from that of dielectric layer 38. For example, before and after the anneal, the reflective index of dielectric layer 36 is higher than that of dielectric layer 38.

Figure 6:
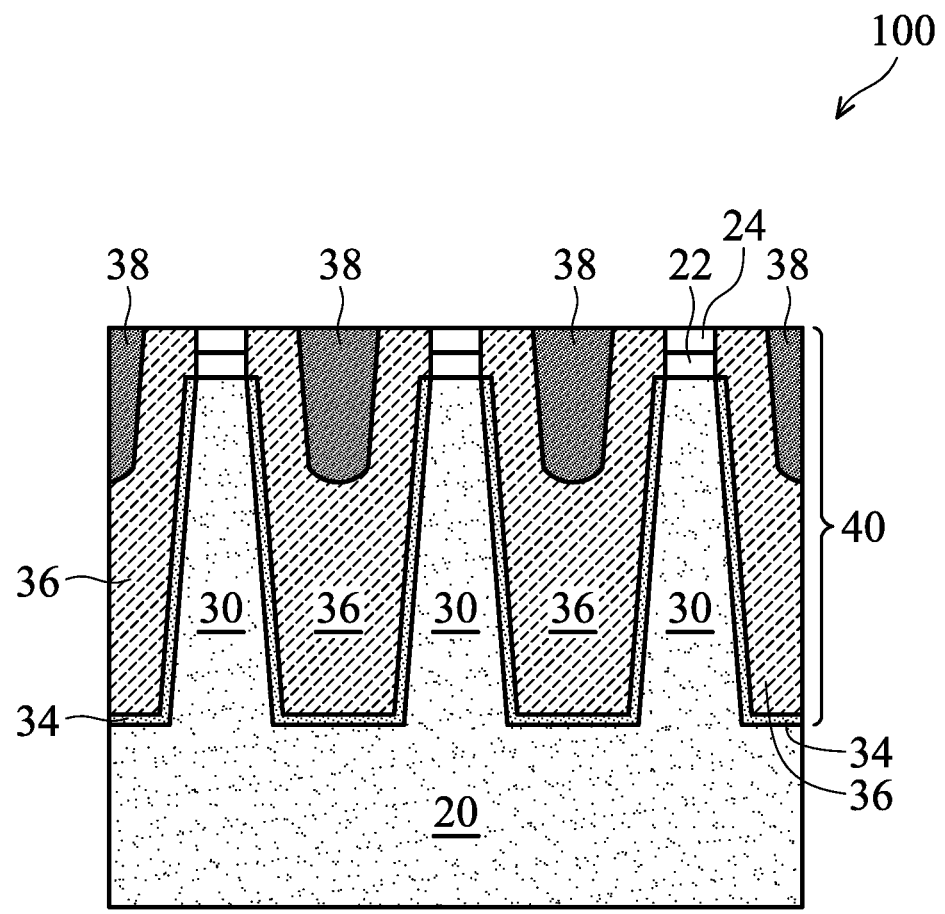

A planarization such as a Chemical Mechanical Polish (CMP) is then performed, as shown in FIG. 6. The respective step is shown as step 216 in the process flow shown in FIG. 10. STI regions 40 are thus formed, which include the remaining portions of liner oxide 34, dielectric layer 36, and dielectric region 38. Mask layer 24 may be used as the CMP stop layer, and hence the top surface of mask layer 24 is substantially level with the top surface of dielectric regions 38 and the top surfaces of dielectric layers 36.

Figure 7:
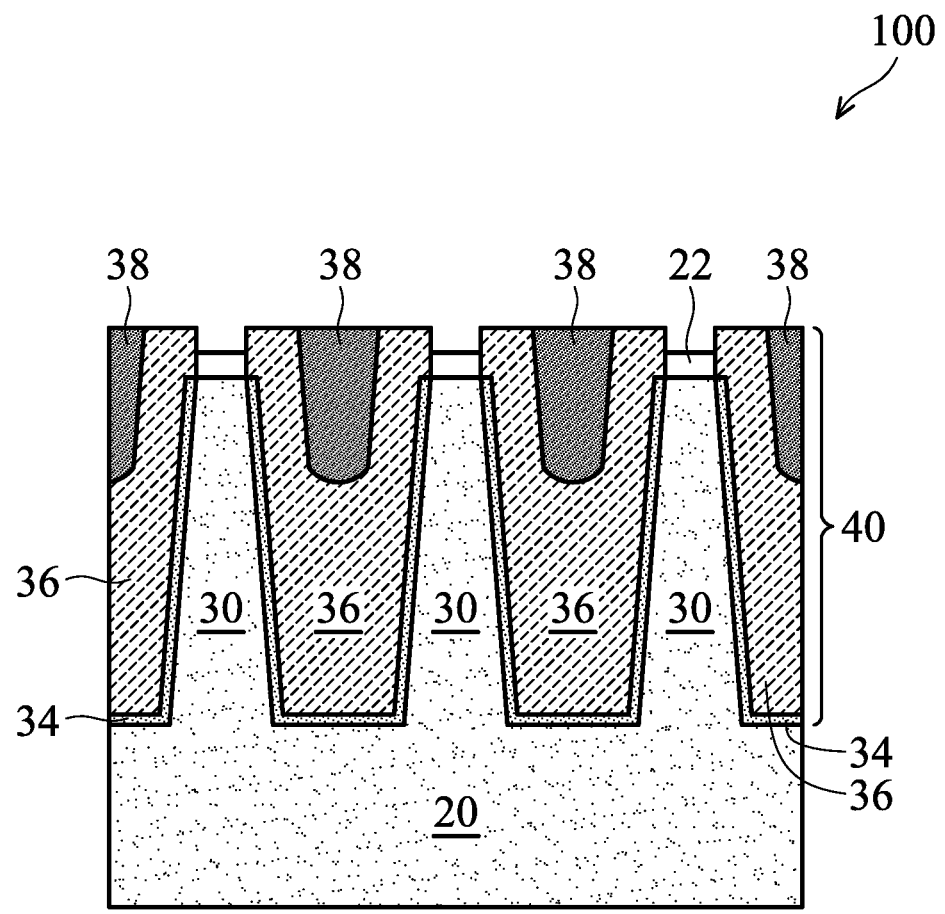
Figure 8A:
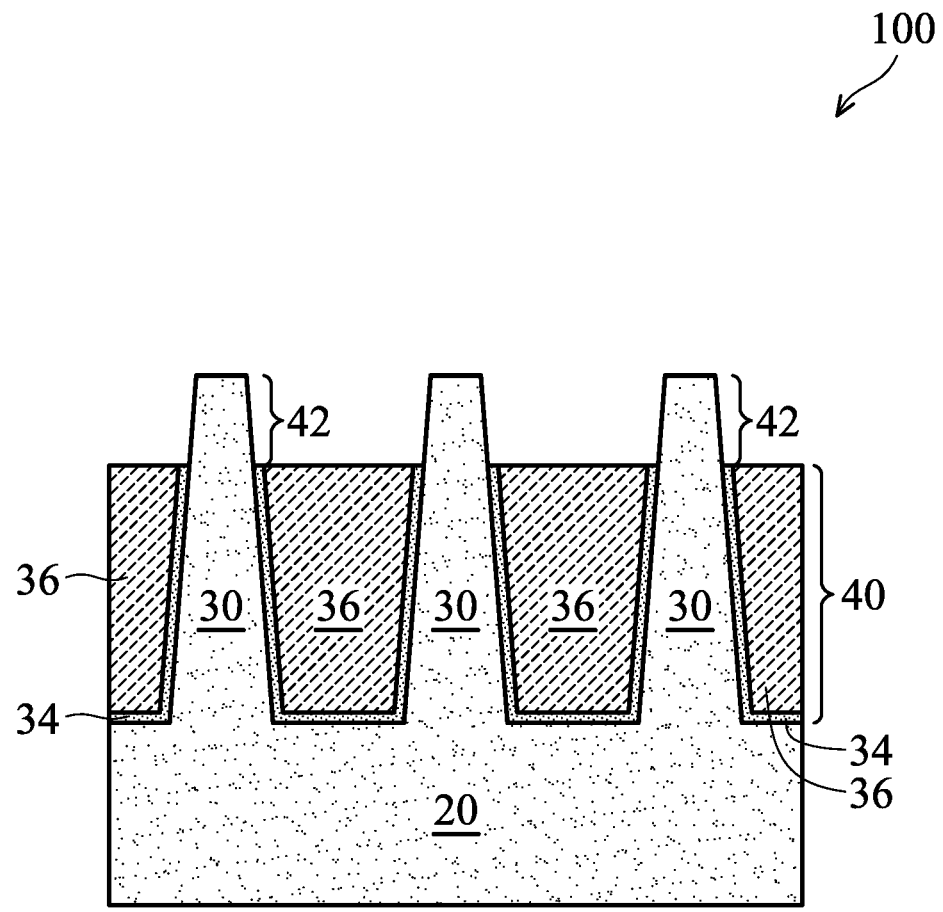
Figure 8B:
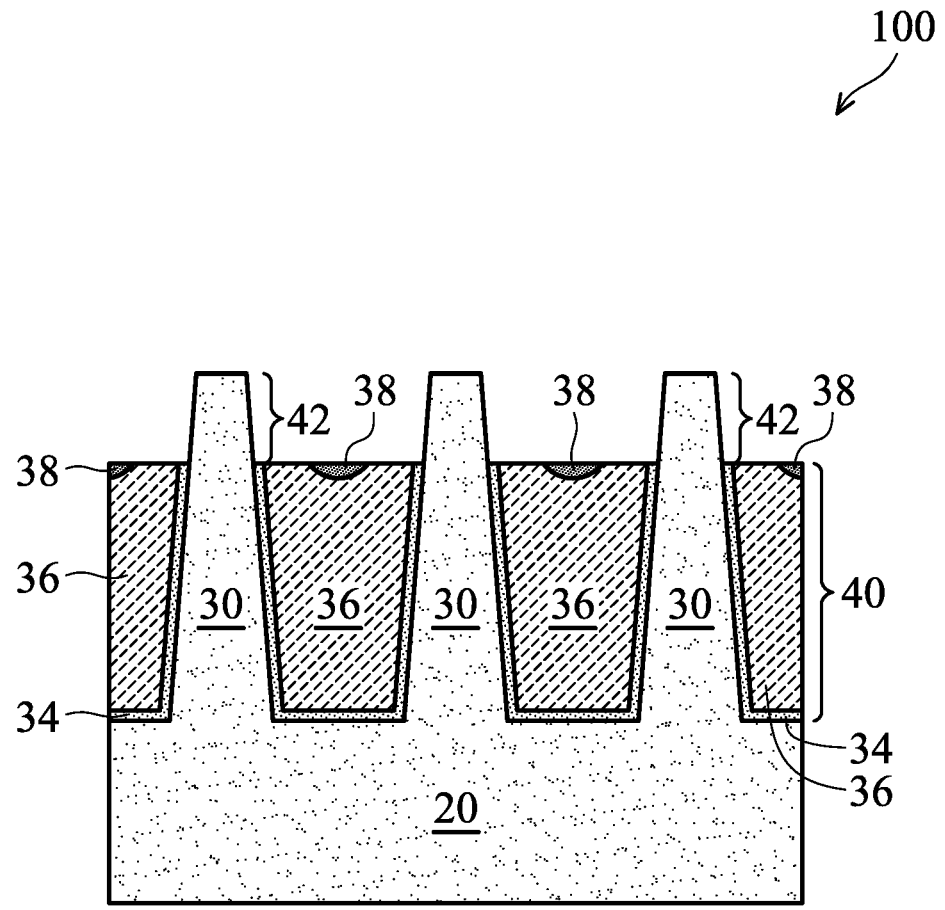

FIG. 7 illustrates the removal of mask layer 24 as shown in FIG. 6. Mask layer 24, if formed of silicon nitride, may be removed in a wet process using hot $H_3PO_4$ as an etchant. Next, the structure shown in FIG. 7 is used to form semiconductor fins through the recessing of STI regions 40, and pad layer 22 is also removed. The resulting structure is shown in FIG. 8A or FIG. 8B. The respective step is shown as step 218 in the process flow shown in FIG. 10.

Referring to FIG. 8A, the portions of semiconductor strips 30 protruding higher than the top surfaces of the remaining STI regions 40 become semiconductor fins 42. The recessing of STI regions 40 may be performed using a dry etch process or a wet etch process. In accordance with some embodiments of the present disclosure, the recessing of STI regions 40 is performed using a dry etch method, in which the process gases including NH 3 and HF are used. In accordance with alternative embodiments of the present disclosure, the recessing of STI regions 40 is performed using a wet etch method, in which the etchant solution is a dilution HF solution, which may have an HF concentration lower than about 1 percent.

The difference in the properties and/or materials of dielectric layers 36 and 38 advantageously result in the difference in the etching rates of dielectric layers 36 and 38. For example, reflective index is an indication related to the etching rate, and the higher the reflective index is, the lower the etching rate is. Accordingly, dielectric layer 36 has an etching rate lower than the etching rate of dielectric layer 38. Due to the pattern loading effect, some STI regions 40 may be etched faster than others during the recessing, resulting in fins 42 in a semiconductor die to have different fin heights, which is undesirable. In accordance with some embodiments of the present disclosure, the etching of the faster-etched STI regions 40 will fully consume dielectric layer 38 earlier that the slow-etched STI regions 40, and the subsequent etching of dielectric layer 36 in the faster-etched STI regions 40 slows down to allow the etching of the slow-etched STI regions 40 to catch up. As a result, the pattern loading effect is reduced, and the uniformity of fin heights throughout the die/wafer 100 is improved.

Figure 9A:
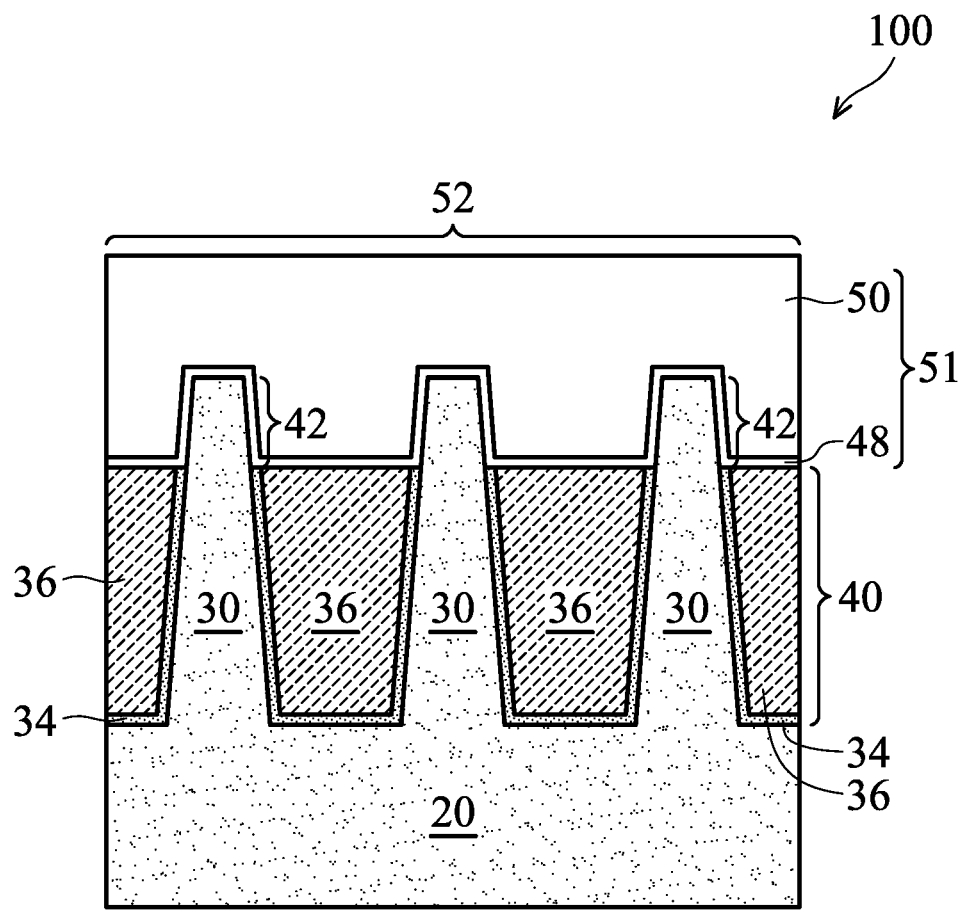
Figure 10:
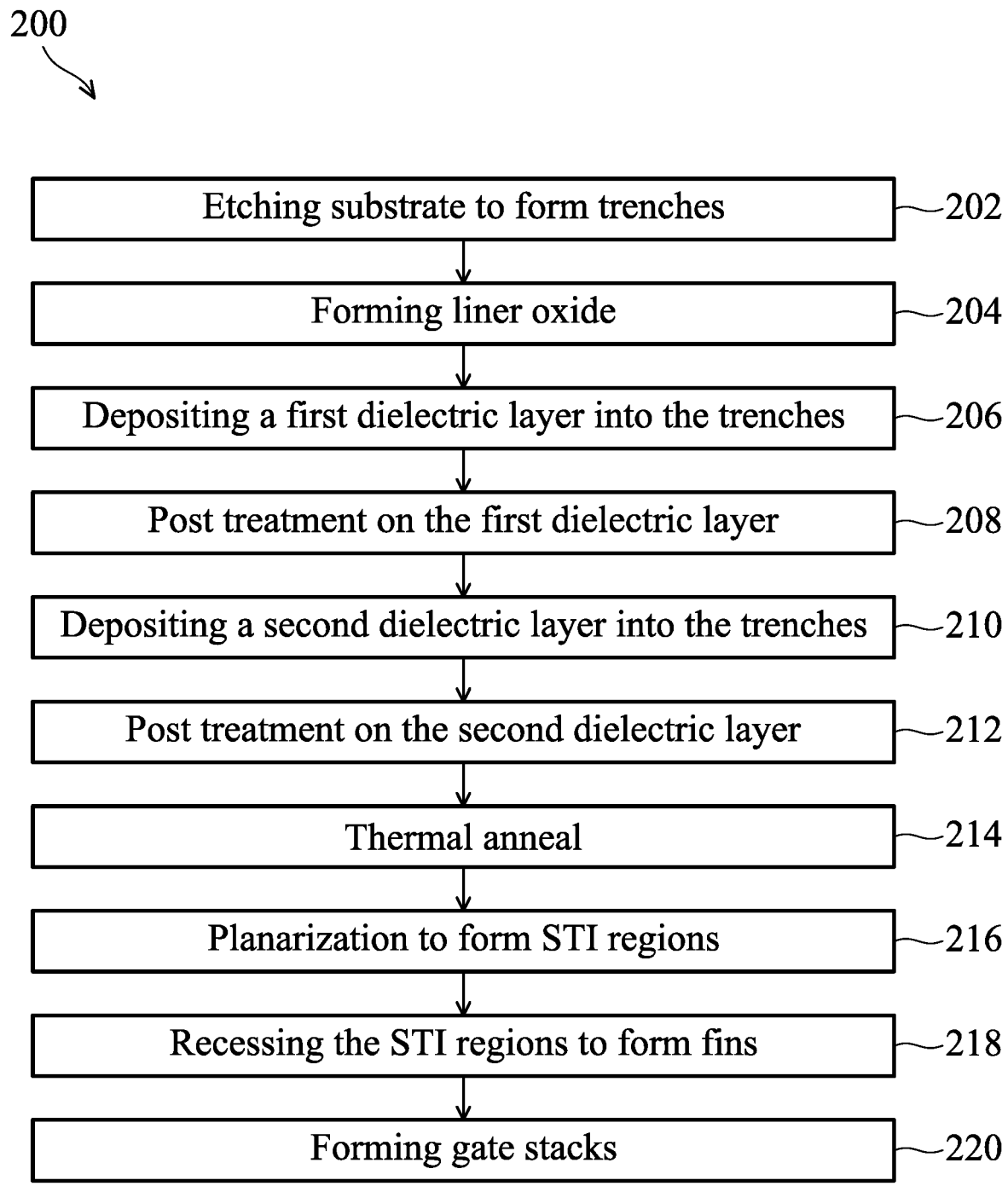
FIG. 10 illustrates a process flow for forming STI regions and a FinFET in accordance with some embodiments.

After STI regions 40 are recessed to form semiconductor fins 42, a plurality of process steps are formed on semiconductor fins 42, which process steps may include well implantations, gate stack formation, a plurality of cleaning steps, and the like. The formation of gate stacks is shown as step 220 in the process flow shown in FIG. 10. FinFETs are thus formed. An exemplary FinFET 52 is illustrated in FIG. 9A, wherein the illustrated gate stack 51 includes gate dielectric 48 on the top surfaces and sidewalls of fins 42, and gate electrode 50 over gate dielectric 48. Gate dielectric 48 may be formed through a thermal oxidation, and hence may include thermal silicon oxide. The formation of gate dielectric 48 may also include a deposition step, and the resulting gate dielectric 48 may include a high-k dielectric material. Gate electrode 50 is then formed on gate dielectric 48. The formation processes of these components are not discussed in detail. Gate dielectric 48 and gate electrode 50 may be formed using a gate-first approach or a gate last approach. The details of the gate-first approach or a gate last approach are not described herein. The remaining components of FinFET 52, which include source and drain regions and source and drain silicides (not in the illustrated plane), are then formed.

Figure 9B:
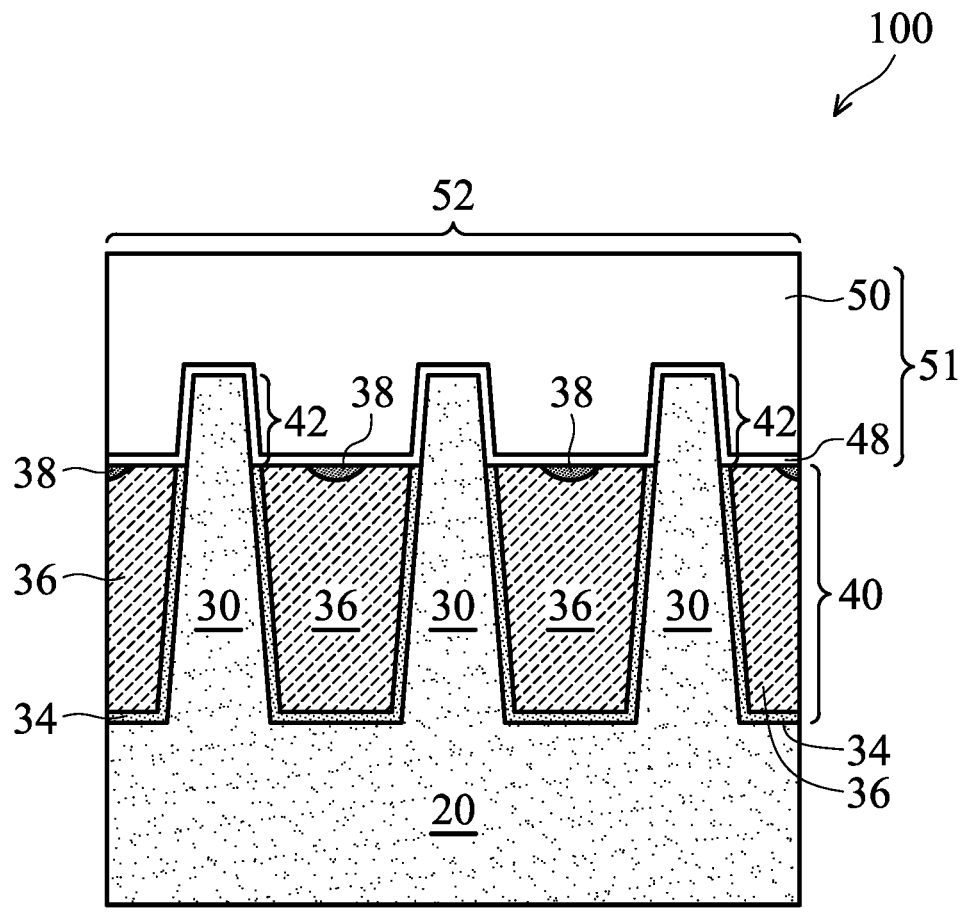

In accordance with some embodiments, as shown in FIGS. 8A and 9A, after STI regions 40 are recessed for forming semiconductor fins 42, dielectric layer 38 is fully removed, and does not exist under gate stack 51. In accordance with alternative embodiments, after STI regions 40 are recessed for forming semiconductor fins 42, some bottom portions of dielectric layer 38 remain, and hence the exposed top surfaces of STI regions 40 include both the top surfaces of dielectric layer 38 and the top surfaces of dielectric layer 36, as shown in FIG. 8B. The resulting FinFET 52 is shown in FIG. 9B.

Figure 9C:
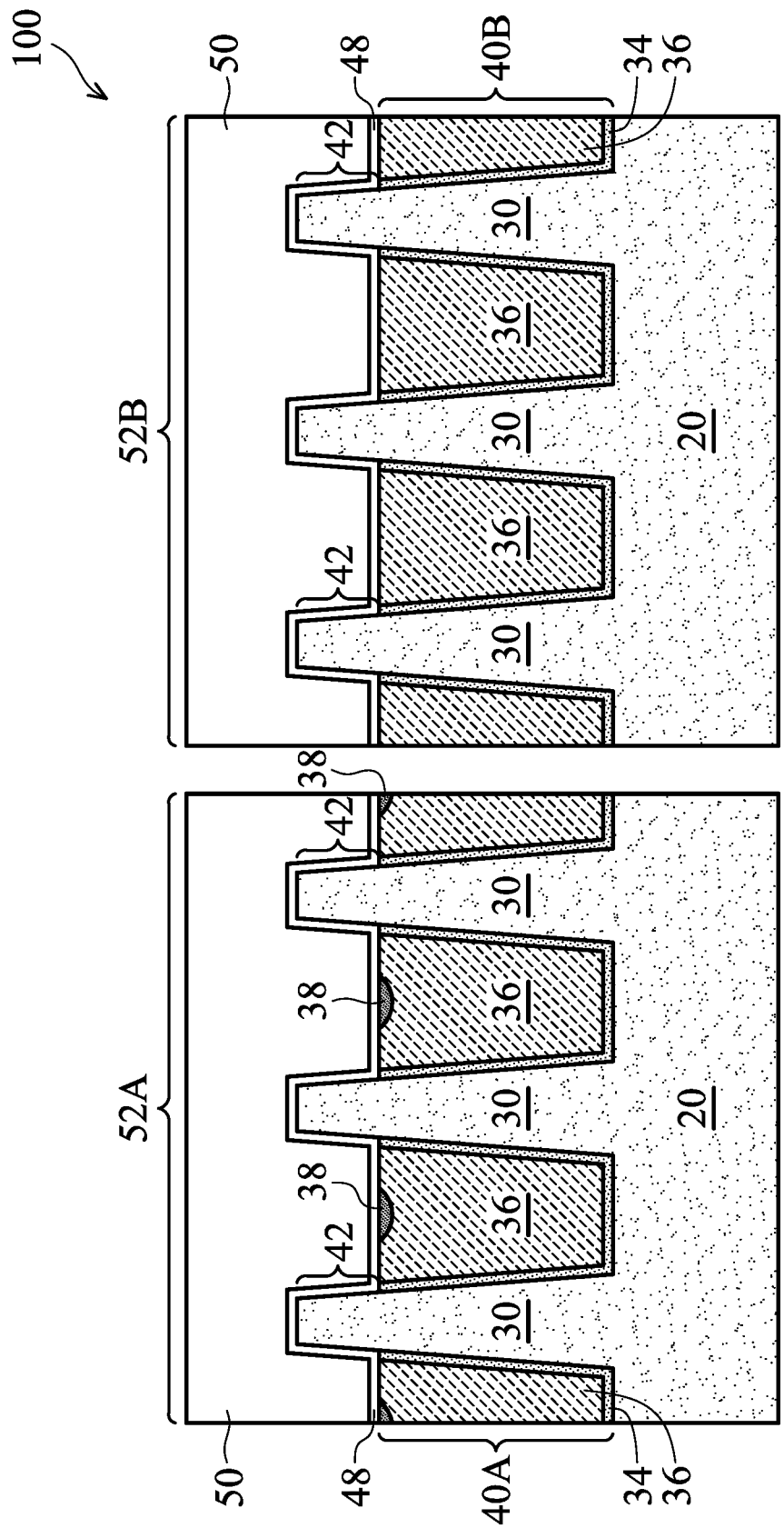

To effectively utilize the difference between dielectric layers 36 and 38 to improve fin height uniformity throughout the die/wafer, the bottom thickness T2 (FIG. 4) of dielectric layer 36 may be so designed that the end point of STI recessing is close to when dielectric layer 38 is fully, or close to fully, consumed, and no significant recessing of dielectric layer 36 is performed after the full consumption of dielectric layer 38. This avoids the situation that all dielectric layers 38 in the recessed STI regions 40 throughout the die are consumed, and loading effect starts picking up again. As a result, in a same semiconductor die/wafer, some of STI regions 40A for forming FinFETs 52A include dielectric layers 38, while other STI regions 40B for forming FinFETs 52B do not include dielectric layer 38, as shown in FIG. 9C.

The embodiments of the present disclosure have some advantageous features. By separating STI formation into two deposition steps and two post treatment steps, the upper portions and lower portions of the STI regions have different properties, and the uniformity in the fin heights of FinFETs is improved.

In accordance with some embodiments of the present disclosure, a method includes etching a semiconductor substrate to form trenches extending into the semiconductor substrate, and depositing a first dielectric layer into the trenches. The first dielectric layer fills lower portions of the trenches. A UV treatment is performed on the first dielectric layer in an oxygen-containing process gas. The method further includes depositing a second dielectric layer into the trenches. The second dielectric layer fills upper portions of the trenches. A thermal treatment is performed on the second dielectric layer in an additional oxygen-containing process gas. After the thermal treatment, an anneal is performed on the first dielectric layer and the second dielectric layer.

In accordance with some embodiments of the present disclosure, a method includes etching a semiconductor substrate to form trenches in the semiconductor substrate, depositing a first dielectric layer into the trenches and filling lower portions of the trenches, and performing a first post treatment on the first dielectric layer in an oxygen-containing process gas. After the first post treatment, a second dielectric layer is deposited into the trenches. The second dielectric layer fills upper portions of the trenches. A second post treatment is performed on the second dielectric layer in an additional oxygen-containing process gas. After the second post treatment, the first dielectric layer has a first reflective index, and the second dielectric layer has a second reflective index lower than the first reflective index. After the second post treatment, an anneal is performed on the first dielectric layer and the second dielectric layer.

In accordance with some embodiments of the present disclosure, a structure includes a semiconductor substrate, and an isolation region extending into the semiconductor substrate. The isolation region includes a first dielectric layer having a first reflective index, and a second dielectric layer over the first dielectric layer. The second dielectric layer has a second reflective index lower than the first reflective index. A gate dielectric contacts a top surface of the isolation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a semiconductor substrate to form a first trench and a second trench in the semiconductor substrate;
   forming a first shallow trench isolation (STI) region in the first trench, wherein the forming the first STI region comprises:
      forming a first dielectric layer;
      forming a second dielectric layer over the first dielectric layer; and
   etching the first STI region, until topmost surfaces of both of the first dielectric layer and the second dielectric layer are lower than a top surface of a portion of the semiconductor substrate that adjoins the first STI region, wherein the portion of the semiconductor substrate adjoining the STI region comprises semiconductor materials continuously extending from the top surface of the portion of the semiconductor substrate to a bottom level of the first trench, and wherein in the etching, both of the first dielectric layer and the second dielectric layer are etched simultaneously by a same etching chemical, and the second dielectric layer has a higher etching rate than the first dielectric layer.

2. The method of claim 1, wherein the forming the first dielectric layer comprises a chemical vapor deposition process or an atomic layer deposition process, and the forming the second dielectric layer comprises a flowable chemical vapor deposition process.

3. The method of claim 1, wherein both of the forming the first dielectric layer and the forming the second dielectric layer comprise flowable chemical vapor deposition processes.

4. The method of claim 3, wherein the forming the first dielectric layer and the forming the second dielectric layer are performed using a same precursor, and different curing methods.

5. The method of claim 4, wherein the forming the first dielectric layer comprises a first curing process using Ultra Violet (UV) light, and the forming the second dielectric layer comprises a second curing process without using Ultra Violet (UV) light.

6. The method of claim 1, wherein the forming the first dielectric layer and the forming the second dielectric layer are performed using different precursors.

7. The method of claim 1, wherein the first dielectric layer comprises a recess therein, and the second dielectric layer fills the recess.

8. The method of claim 1 further comprising forming a second STI region in the semiconductor substrate, wherein the forming the second STI region comprises:
   forming a third dielectric layer, wherein the first dielectric layer and the second dielectric layer are formed in first common processes;
   forming a fourth dielectric layer, wherein the second dielectric layer and the fourth dielectric layer are formed in second common processes; and
   performing an etching process to recess the first STI region and the second STI region, wherein when the etching process is stopped, the second dielectric layer is fully removed, and a portion of the fourth dielectric layer remains.

9. The method of claim 8 further comprising:
   forming a first gate stack extending on the first STI region and a first semiconductor region on a side of the first STI region; and
   forming a second gate stack extending on the second STI region and a second semiconductor region on a side of the second STI region.

10. The method of claim 1, wherein the first dielectric layer has more Si—O bonds than the second dielectric layer, and the second dielectric layer has more Si—N bonds than the first dielectric layer.

11. The method of claim 1, wherein before the first STI region is etched, the topmost surfaces of both of the first dielectric layer and the second dielectric layer are higher than the top surface of a portion of the semiconductor substrate.

12. The method of claim 1 further comprising continuing etching the first STI region to fully remove the second dielectric layer in the first STI region.

13. A method comprising:
   etching a semiconductor substrate to form trenches in the semiconductor substrate;
   depositing a plurality of dielectric layers into the trenches, wherein the plurality of dielectric layers fill the trenches to form a first shallow trench isolation (STI) region and a second STI region, and wherein the plurality of dielectric layers comprise:
      a liner dielectric layer contacting the semiconductor substrate;
      a first dielectric layer over the liner dielectric layer; and
      a second dielectric layer over the first dielectric layer;
   recessing the first STI region and the second STI region simultaneously, wherein after the recessing, the second dielectric layer is fully removed from the first STI region, and a portion of the second dielectric layer is left in the second STI region;
   forming a first gate stack over and contacting the first STI region and a first protruding semiconductor fin aside of the first STI region; and
   forming a second gate stack over and contacting the second STI region and a second protruding semiconductor fin aside of the second STI region.

14. The method of claim 13, wherein the forming the plurality of dielectric layers comprise:
   depositing the first dielectric layer;
   performing a first post treatment process on the first dielectric layer;
   after the first post treatment process, depositing the second dielectric layer over the first dielectric layer; and
   performing a second post treatment process on the second dielectric layer.

15. The method of claim 14 further comprising:
   after the second post treatment process, performing an annealing process on both of the first dielectric layer and the second dielectric layer.

16. The method of claim 13, wherein the first dielectric layer has more Si—O bonds than the second dielectric layer.

17. The method of claim 13, wherein the second dielectric layer has more Si—N bonds than the first dielectric layer.

18. A method comprising:
   etching a semiconductor substrate to form a trench extending into the semiconductor substrate;
   depositing a first dielectric layer into the trench using first precursors;
   performing a first curing process on the first dielectric layer using a first process condition;

after the first curing process, depositing a second dielectric layer into the trench using second precursors same as the first precursors, wherein the second dielectric layer is over the first dielectric layer;

performing a second curing process on the second dielectric layer using a second process condition different from the first process condition;

after the second curing process, performing an annealing process on both of the first dielectric layer and the second dielectric layer using oxygen ($O_2$) as a process gas; and performing a recessing process, wherein both of the first dielectric layer and the second dielectric layer are recessed in the recessing process, and wherein during the recessing process, the second dielectric layer has a higher etching rate than the first dielectric layer.

19. The method of claim 18, wherein the first process condition comprises UV light, and the second process condition is free from UV light.

20. The method of claim 18, wherein the first curing process and the second curing process result in the first dielectric layer to have more Si—O bonds than the second dielectric layer, and the second dielectric layer to have more Si—N bonds than the first dielectric layer.

* * * * *